(12) United States Patent
Fan et al.

(10) Patent No.: US 12,069,923 B2
(45) Date of Patent: Aug. 20, 2024

(54) DISPLAY SUBSTRATE, DISPLAY PANEL, ELECTRONIC DEVICE, AND DISPLAY METHOD

(71) Applicant: BOE TECHNOLOGY GROUP CO., LTD., Beijing (CN)

(72) Inventors: Yan Fan, Beijing (CN); Yipeng Chen, Beijing (CN); Yang Wang, Beijing (CN); Yansong Li, Beijing (CN); Xing Fan, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/800,462

(22) PCT Filed: May 19, 2021

(86) PCT No.: PCT/CN2021/094514
§ 371 (c)(1),
(2) Date: Aug. 17, 2022

(87) PCT Pub. No.: WO2021/258927
PCT Pub. Date: Dec. 30, 2021

(65) Prior Publication Data
US 2023/0189600 A1    Jun. 15, 2023

(30) Foreign Application Priority Data
Jun. 23, 2020  (CN) .......................... 202010582835.8

(51) Int. Cl.
*H10K 59/179*  (2023.01)
*G09G 3/3216*  (2016.01)
(Continued)

(52) U.S. Cl.
CPC ......... *H10K 59/179* (2023.02); *G09G 3/3216* (2013.01); *G09G 3/3225* (2013.01);
(Continued)

(58) Field of Classification Search
CPC .............. H10K 59/179; H10K 59/131; H10K 59/80515; H10K 59/80521; H10K 59/90;
(Continued)

(56) References Cited

U.S. PATENT DOCUMENTS

2005/0168138 A1* 8/2005 Okunaka ................ H10K 59/88
313/504
2016/0254493 A1 9/2016 Sun
(Continued)

FOREIGN PATENT DOCUMENTS

CN   103996694 A   8/2014
CN   104485344 A   4/2015
(Continued)

OTHER PUBLICATIONS

Extended European Search Report for Application No. 21827860. 4-1212, dated Jun. 30, 2023, 12 Pages.
(Continued)

*Primary Examiner* — Adam R. Giesy
(74) *Attorney, Agent, or Firm* — Brooks Kushman P.C.

(57) ABSTRACT

A display substrate, a display panel, an electronic device and a display method. The display substrate includes first electrodes in a first display region and second electrodes in a second display region, a first light-emitting portion in the first display region and a second light-emitting portion in the second display region, and the first electrodes being of strip shapes extending along a first direction and being spaced apart from each other along a second direction; third electrodes in the first display region and a fourth electrode in the second display region, the third electrode being of strip shapes extending along the second direction and being spaced apart from each other along the first direction.

18 Claims, 8 Drawing Sheets

(51) Int. Cl.
*G09G 3/3225* (2016.01)
*H10K 59/131* (2023.01)
*H10K 59/80* (2023.01)
*H10K 59/90* (2023.01)

(52) U.S. Cl.
CPC ..... *H10K 59/131* (2023.02); *H10K 59/80515* (2023.02); *H10K 59/80521* (2023.02); *H10K 59/90* (2023.02); *G09G 2300/0426* (2013.01); *G09G 2300/06* (2013.01); *G09G 2300/08* (2013.01)

(58) Field of Classification Search
CPC .... H10K 59/12; H10K 59/65; H10K 59/8791; H10K 59/80516; H10K 59/80518; H10K 59/80522; H10K 59/80524; H10K 59/88; H10K 59/17; G09G 3/3216; G09G 3/3225; G09G 2300/0426; G09G 2300/06; G09G 2300/08
See application file for complete search history.

(56) References Cited

U.S. PATENT DOCUMENTS

| | | | |
|---|---|---|---|
| 2019/0386074 A1* | 12/2019 | Li | H10K 59/88 |
| 2020/0211480 A1 | 7/2020 | Xiang et al. | |
| 2020/0251539 A1 | 8/2020 | Fu | |
| 2021/0134909 A1 | 5/2021 | Liu et al. | |
| 2021/0265596 A1 | 8/2021 | Lou et al. | |
| 2021/0305336 A1 | 9/2021 | Tang et al. | |
| 2022/0069023 A1 | 3/2022 | Lou et al. | |
| 2022/0077276 A1 | 3/2022 | Wang | |
| 2022/0157898 A1 | 5/2022 | Lou et al. | |

FOREIGN PATENT DOCUMENTS

| | | |
|---|---|---|
| CN | 108717244 A | 10/2018 |
| CN | 109600459 A | 4/2019 |
| CN | 109801950 A | 5/2019 |
| CN | 110085766 A | 8/2019 |
| CN | 110634445 A | 12/2019 |
| CN | 110767168 A | 2/2020 |
| CN | 110767833 A | 2/2020 |
| CN | 110767836 A | 2/2020 |
| CN | 110783370 A | 2/2020 |
| CN | 110783384 A | 2/2020 |
| CN | 110783391 A | 2/2020 |
| CN | 111029382 A | 4/2020 |
| CN | 111192902 A | 5/2020 |
| KR | 20000001664 A | 1/2000 |
| KR | 20010113334 A | 12/2001 |
| KR | 100390409 B1 | 7/2003 |

OTHER PUBLICATIONS

International Search Report and Written Opinion for Application No. PCT/CN2021/094514, dated Aug. 10, 2021, 9 Pages.

* cited by examiner

DISPLAY SUBSTRATE, DISPLAY PANEL, ELECTRONIC DEVICE, AND DISPLAY METHOD

CROSS-REFERENCE TO RELATED APPLICATION APPLICATIONS

This application is the U.S. national phase of PCT Application No. PCT/CN2021/094514 filed on May 19, 2021, which claims priority to Chinese Patent Application No. 202010582835.8 filed on Jun. 23, 2020, which are incorporated herein by reference in their entireties.

TECHNICAL FIELD

The present disclosure relates to the field of display technology, in particular to a display substrate, a display panel, an electronic device and a display method.

BACKGROUND

With continuous development of science and technology, electronic devices (such as mobile phones) becomes more and more popular around us, and we are constantly asking for an upgrade in the experience of electronic devices. For screen ratio of mobile phones, there are many full-screen products in the market, e.g., water drop screen, bang screen, which are challenging the boundaries of the screen of the mobile phones. But because of a front camera, none of the mobile phones are true full-screen phones.

In order to achieve a true full-screen, there is a proposal to place a front camera at the bottom of a display screen. However, a screen region where the front camera is placed should not only realize the display function, but also meet the requirements of photography, which requires a higher light transmittance of the screen. Therefore, how to improve the light transmittance of the screen in the region has become a technical problem to be solved.

SUMMARY

An object of the present disclosure is to provide a display substrate, a display panel, an electronic device and a display method, so as to improve the light transmittance of a display screen corresponding to an under-screen camera.

In one aspect, the present disclosure provides in some embodiments a display substrate including: a driving back plate, having a first display region and a second display region; an anode pattern, arranged at a side of the driving back plate, and including a plurality of first electrodes in the first display region and a plurality of second electrodes in the second display region, and the plurality of first electrodes being of strip shapes extending along a first direction and being spaced apart from each other along a second direction; a light-emitting layer, arranged at a side of the anode pattern away from the driving back plate, and including a first light-emitting portion in the first display region and a second light-emitting portion in the second display region; and a cathode pattern, arranged at a side of the light-emitting layer away from the driving back plate, and including a plurality of third electrodes in the first display region and a fourth electrode in the second display region, and the plurality of third electrodes being of strip shapes extending along the second direction and being spaced apart from each other along the first direction. The plurality of first electrodes and the plurality of third electrodes are arranged in an intersecting manner to form a plurality of intersections, a part of the intersections form light-emitting units, and a part of the intersections form virtual light-emitting units.

Optionally, a width of the first electrode in the second direction at an intersection where the light-emitting unit is formed is greater than a width of the first electrode in the second direction at an intersection where the virtual light-emitting unit is formed, or a width of the third electrode in the first direction at an intersection where the light-emitting unit is formed is greater than a width of the third electrode in the first direction at an intersection where the virtual light-emitting unit is formed.

Optionally, two of four intersections in two adjacent rows and two adjacent columns form the light-emitting units, the other two of the four intersections form the virtual light-emitting units, and two intersections forming the light-emitting units are arranged on a diagonal line of a rectangle formed by the four intersections.

Optionally, the first electrode and the third electrode are transparent electrodes, the second electrode is a reflective electrode, and the fourth electrode is a translucent electrode.

Optionally, each of the first electrode and the third electrode includes a transparent metal oxide layer, the second electrode includes a first transparent metal oxide layer, a metal layer and a second transparent metal oxide layer, and the fourth electrode includes a transparent metal layer.

Optionally, the first electrode is a reflective electrode, the third electrode is a transparent electrode, the second electrode is a reflective electrode, and the fourth electrode is a translucent electrode.

Optionally, each of the first electrode and the second electrode includes a first transparent metal oxide layer, a metal layer and a second transparent metal oxide layer, the third electrode includes a transparent metal oxide layer, and the fourth electrode includes a transparent metal layer.

Optionally, the first display region includes a pixel region and a non-pixel region arranged at a periphery of the pixel region, and the first electrode is merely arranged in the pixel region.

Optionally, the second display region further includes a capping layer arranged at a side of the second electrode away from the driving back plate, and the capping layer includes a first portion arranged at a same layer and made of a same material as the third electrode.

Optionally, both the first electrode and the second electrode are reflective electrodes, and both the third electrode and the fourth electrode are translucent electrodes.

Optionally, each of the first electrode and the second electrode includes a first transparent metal oxide layer, a metal layer and a second transparent metal oxide layer, and each of the third electrode and the fourth electrode includes a transparent metal layer.

Optionally, the first display region includes a pixel region and a non-pixel region arranged at a periphery of the pixel region, the non-pixel region is provided with an organic light-emitting layer and a transparent material pattern, the transparent material pattern is arranged at a side of the organic light-emitting layer away from the driving back plate, and the transparent material pattern restrains deposition of a material for forming the translucent electrode.

Optionally, a thickness of the transparent material pattern is 5 nm to 10 nm.

Optionally, the material of the transparent material pattern includes fluoropolymer, polyethylene benzene, polyvinylcarbazole, or a polymer formed by a plurality of monomers, the monomer has an end group, and the end group includes at least one of biphenyl, phenyl, fluorene, and phenylene.

Optionally, the second display region is of a concave shape with a notch at the top, and the first display region is arranged in the notch.

In another aspect, the present disclosure provides in some embodiments a display panel, including the above-mentioned display substrate.

In yet another aspect, the present disclosure provides in some embodiments an electronic device, including the above-mentioned display panel and an under-screen camera. The under-screen camera is arranged at a side of the first display region of the display panel away from the display side of the electronic device, and a projection of a photo-sensitive surface of the under-screen camera onto the first display region is arranged in the first display region.

In still yet another aspect, the present disclosure provides in some embodiment a display method for the above-mentioned electronic device, the method including: in a display mode, if it is detected that the under-screen camera is turned on, the light-emitting units in the first display region is controlled to be turned off; and if it is detected that the under-screen camera is turned off, the light-emitting units in the first display region is controlled to be turned on.

In the embodiments of the present disclosure, when the display substrate is applied to the electronic device, the first display region and the under-screen camera are arranged opposite to each other, if the camera is detected to be turned on, the first display region is controlled not to display and to be in a light transmission state, and if camera is detected to be turned off, the first display region and the second display region are controlled to display together. Active-matrix Organic Light-emitting Diode (AMOLED) is arranged in the second display region to ensure the display effect, and Passive-matrix Organic Light-emitting Diode (PMOLED) is arranged in the first display region, driving control Integrated Circuit (IC) is relatively simple and virtual light-emitting units are formed, and light transmittance of the screen is relatively high, so as to ensure photographing effect of the camera.

BRIEF DESCRIPTION OF THE DRAWINGS

Through reading the detailed description hereinafter, the other advantages and benefits will be apparent to a person skilled in the art. The drawings are merely used to show the preferred embodiments, but shall not be construed as limiting the present disclosure. In addition, in the drawings, same reference symbols represent same members. In these drawings.

DETAILED DESCRIPTION

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

Organic Light-emitting Diode (OLED) includes AMOLED and PMOLED. The driving control IC of AMOLED is relatively complex, the light transmittance of the screen in the display region of AMOLED is relatively low, which will affect the photographing effect of the under-screen camera. The driving control IC of PMOLED is relatively simple, the light transmittance of the screen in the display region of PMOLED is relatively high, which is conducive to the photographing of the under-screen camera. Therefore, in the embodiments of the present disclosure, display region of the display substrate is divided into two regions: a display region (the first display region) corresponding to the under-screen camera and the other display region (the second display region). The first display region not only needs to display normally, but also needs to be able to transmit light to realize photographing function, and a requirement of the light transmittance is high, as a result, PMOLED is used, and virtual light-emitting units are formed at some of the position to improve the light transmittance of the screen. The second display region still use AMOLED to ensure the display effect.

Figure 1:
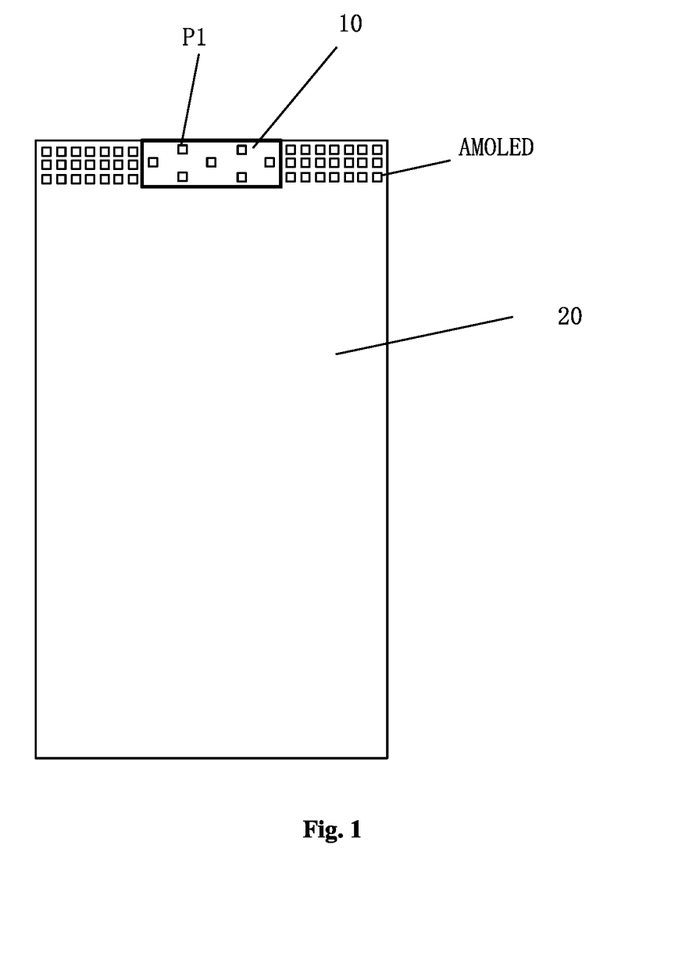
FIG. 1 is a schematic view showing a display substrate according to one embodiment of the present disclosure.
Figure 2:
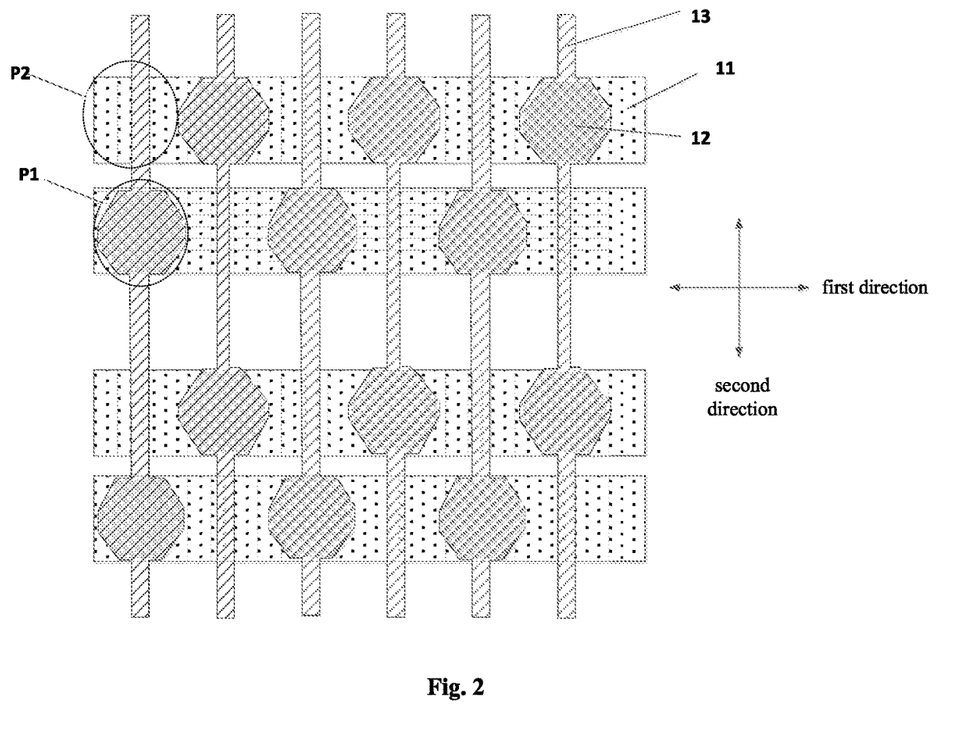
FIG. 2 is a schematic view showing a first display region according to one embodiment of the present disclosure.
Figure 3:
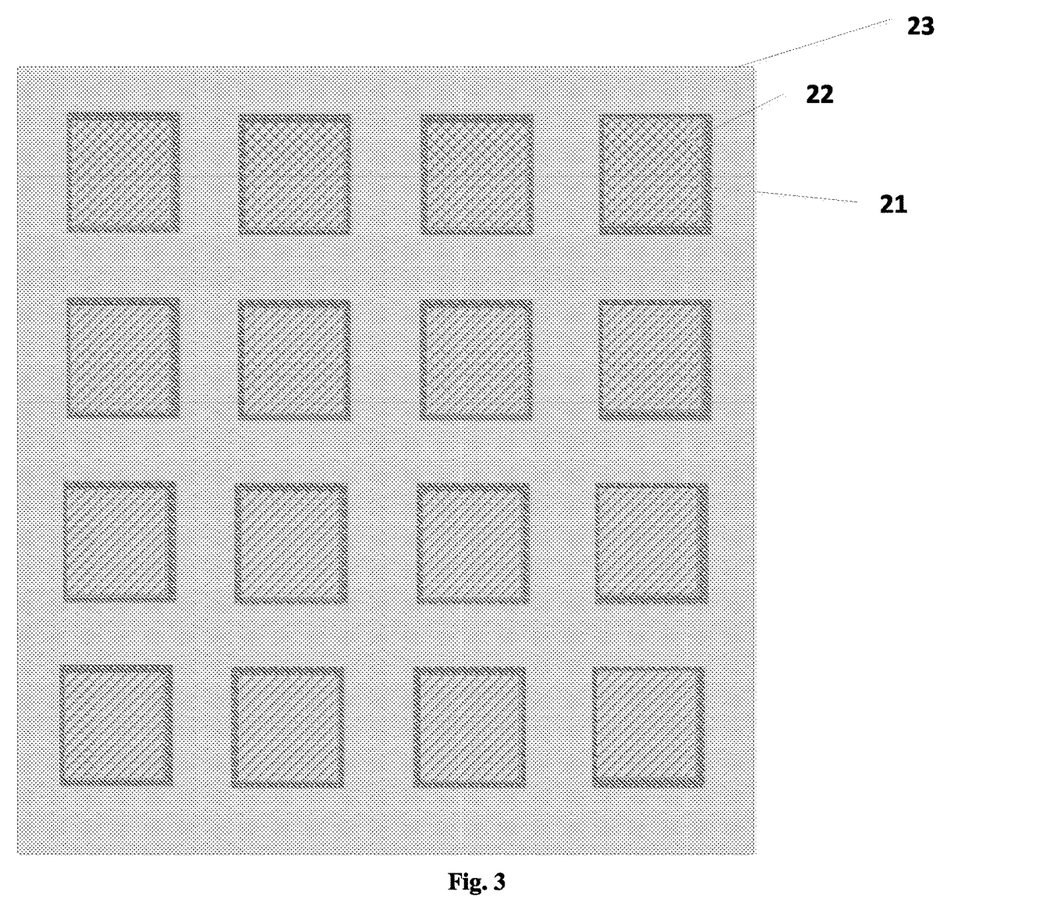
FIG. 3 is a schematic view showing a second display region according to one embodiment of the present disclosure.

As shown in FIG. 1, FIG. 2 and FIG. 3, the present disclosure provides in some embodiments a display substrate including: a driving back plate, having a first display region 10 and a second display region 20; an anode pattern, arranged at a side of the driving back plate, and including a plurality of first electrodes 11 in the first display region 10 and a plurality of second electrodes 21 in the second display region 20, and the plurality of first electrodes 11 being of strip shapes extending along a first direction and being spaced apart from each other along a second direction; a light-emitting layer, arranged at one a of the anode pattern away from the driving back plate, and including a first light-emitting portion 12 in the first display region 10 and a second light-emitting portion 22 in the second display region 20; and a cathode pattern, arranged at a side of the light-emitting layer away from the driving back plate, and including a plurality of third electrodes 13 in the first display region 10 and a fourth electrode 23 in the second display region 20, and the plurality of third electrodes 13 being of strip shapes extending along the second direction and being spaced apart from each other along the first direction. The plurality of first electrodes 11 and the plurality of third electrodes 13 are arranged in an intersecting manner to form a plurality of intersections, a part of the intersections form light-emitting units P1s, and a part of the intersections form virtual light-emitting units P2s.

Figure 4:
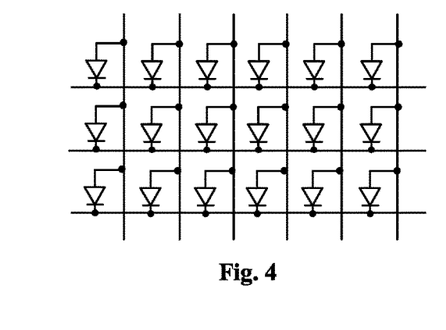
FIG. 4 is a schematic view showing PMOLED.

FIG. 4 is a schematic view of PMOLED, two electrodes of the PMOLED are in a matrix structure, that is, PMOLEDs in a same row share an electrode (e.g., an anode), and PMOLEDs in a same column share an electrode (e.g., a cathode). In displaying, the PMOLEDs may be lighted row by row or column by column, the PMOLEDs are usually lighted row by row and column electrodes are data electrodes. An implementation mode is that a pulse signal is cyclically applied to each row electrode, and at the same time, each column electrode provides driving current pulse signal of the PMOLED corresponding to the row, so as to realize the display of all PMOLEDs of the row. PMOLED has a much simpler structure than AMOLED.

In the embodiments of the present disclosure, when the display substrate is applied to the electronic device, the first display region and the under-screen camera are arranged opposite to each other, if the camera is detected to be turned on, the first display region is controlled not to display and to be in a light transmission state, and if camera is detected to be turned off, the first display region and the second display region are controlled to display together. AMOLED is arranged in the second display region to ensure the display effect, and PMOLED is arranged in the first display region, driving control IC is relatively simple and virtual light-emitting units are formed in the first display region, and light transmittance of the screen is relatively high, so as to ensure photographing effect of the camera.

Figure 5:
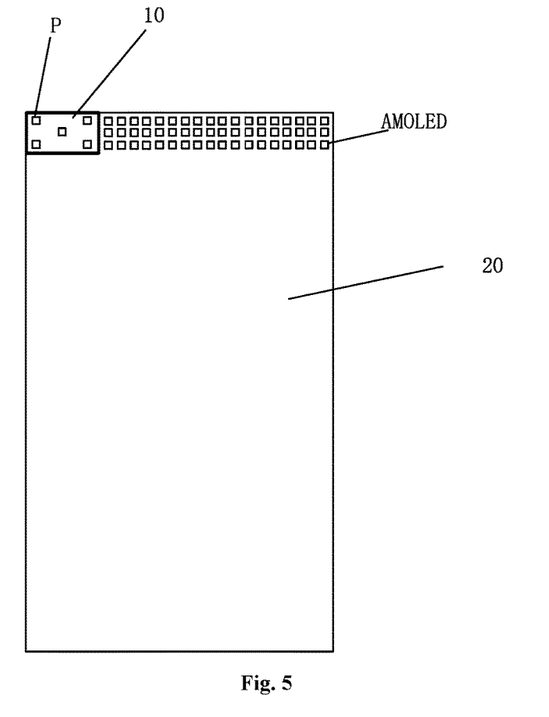
FIG. 5 is a schematic view showing another display substrate according to one embodiment of the present disclosure.

As shown in FIG. 1, the second display region 20 of a concave shape with a notch at the top, and the first display region 10 is arranged in the notch. Of course, in some other embodiments of the present disclosure, a position of the first display region 10 is not limited thereto. For example, as shown in FIG. 5, the first display region 10 may also be arranged in one corner region or two corner regions of the second display region 20. An arrangement position of the first display region 10 is determined in accordance with a position of the under-screen camera of the electronic device to be applied.

In the embodiments of the present disclosure, a shape of the first display region 10 is of a rectangular shape, an ellipse shape, a circle shape, or other shapes.

In the embodiments of the present disclosure, as shown in FIG. 1 and FIG. 5, a resolution of the light-emitting unit P1 in the first display region 10 is smaller than a resolution of AMOLED in the second display region 20. That is, the quantity of PMOLEDs per unit area in the first display region 10 is smaller than the quantity of AMOLEDs per unit area in the second display region 20, so as to further improve the light transmittance of the first display region 10. In the embodiments of the present disclosure shown in FIG. 1, the quantity of rows of the PMOLEDs in the first display region 10 is the same as the quantity of rows of the AMOLEDs in the second display region 20 on both sides of the first display region 10, and the PMOLEDs and the AMOLEDs are aligned to each other to facilitate display. However, in the column direction, an interval between two adjacent PMOLEDs is greater than an interval between two adjacent AMOLEDs to improve the light transmittance. Alternatively, in some other embodiments of the present disclosure, the quantity of rows of the PMOLEDs in the first display region 10 may also be less than the quantity of rows of the AMOLEDs in the second display regions 20 on both sides of the first display region 10, and a manner to reduce resolution of the first display region is not limited in the embodiments of the present disclosure.

In the embodiments of the present disclosure, the light-emitting units in the first display region 10 may be arranged more closely (reducing spacing between adjacent first electrodes and/or spacing between adjacent third electrodes), so that the resolution of the light-emitting units in the first display region 10 is the same as the resolution of the AMOLEDs in the second display region 20.

In the embodiments of the present disclosure, a distance between adjacent first electrodes is 10 μm to 20 μm.

In the embodiments of the present disclosure, a width of the first electrode 11 in the second direction at an intersection where the light-emitting unit P1 is formed is greater than a width of the first electrode 11 in the second direction at an intersection where the virtual light-emitting unit P2 is formed, or a width of the third electrode 13 in the first direction at an intersection where the light-emitting unit P1 is formed is greater than a width of the third electrode 13 in the first direction at an intersection where the virtual light-emitting unit P2 is formed. In the embodiments of the present disclosure shown in FIG. 3, a width of the third electrode 13 in the first direction at an intersection where the light-emitting unit P1 is formed is greater than a width of the third electrode 13 in the first direction at an intersection where the virtual light-emitting unit P2 is formed. The width of the first electrode or the third electrode at the intersection where the virtual light-emitting unit P2 is formed is less than a predetermined threshold. The above-described width of the first electrode or the third electrode at the intersection where the virtual light-emitting unit P2 is formed is narrow, an effective light-emitting unit may not be formed, but the light transmittance is significantly higher than the light transmittance of the light-emitting unit P1, thereby to improve the light transmittance of the first display region 10.

In some other embodiments of the present disclosure, the virtual light-emitting unit may also be formed by not providing the first light-emitting portion at the intersection point where the virtual light-emitting unit P2 is formed.

As shown in FIG. 2, in the embodiments of the present disclosure, two of four intersections in two adjacent rows and two adjacent columns form the light-emitting units, the other two of the four intersections form the virtual light-emitting units, and two intersections forming the light-emitting units are arranged on a diagonal line of a rectangle formed by the four intersections, so as to distribute the light-emitting units P1s more uniformly.

A film layer structure of the PMOLED and a film layer structure of the AMOLED in the embodiments of the present disclosure will be described hereinafter.

In order to realize the light transmission of the first display region, in the embodiments of the present disclosure, the first electrode and the third electrode are transparent electrodes, the second electrode is a reflective electrode, and the fourth electrode is a translucent electrode.

In the embodiments of the present disclosure, each of the first electrode and the third electrode includes a transparent metal oxide layer, the second electrode includes a first transparent metal oxide layer, a metal layer and a second transparent metal oxide layer, and the fourth electrode includes a transparent metal layer.

The transparent metal oxide may be made of indium tin oxide (ITO) or indium zinc oxide (IZO), and the transparent metal layer may be made of metal or metal alloy.

An embodiment is given hereinafter.

First Embodiment

Figure 6:
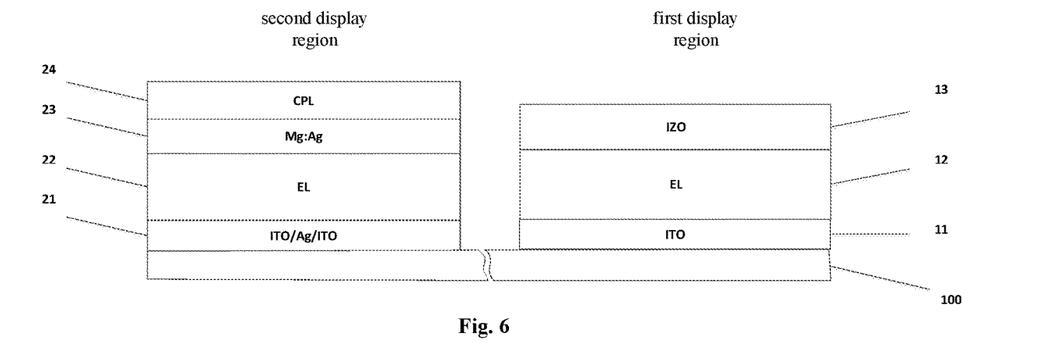
FIG. 6 is a schematic view showing a film layer of a display substrate according to a first embodiment of the present disclosure.

As shown in FIG. 6, the present disclosure provides in some embodiments a display substrate including a driving back plate 100. The driving back plate 100 includes a first display region and a second display region, the second display region is provided with a plurality of AMOLEDs arranged in an array, and the first display region is provided with a plurality of light-emitting units (i.e. PMOLEDs) arranged in an array and a plurality of virtual light-emitting units.

The AMOLEDs in the second display region includes a reflective anode 21, an organic light-emitting layer (EL) 22, a translucent cathode 23 and a capping layer 24. The reflective anode 21 is a laminated structure of ITO, Ag and ITO, and the translucent cathode 13 is made of an alloy material of Mg and Ag.

In order to improve the light transmittance of the first display region, different from the second display region, the light-emitting unit in the first display region includes a transparent anode 11, an organic light-emitting layer 12, and a transparent cathode 13, the transparent anode 11 is made of ITO, and the transparent cathode 13 is made of IZO.

In the embodiments of the present disclosure, a thickness of the transparent anode 11 is 100 nm, and a thickness of the transparent cathode 13 is 200 nm to 400 nm.

In the embodiments of the present disclosure, a thickness of the organic light-emitting layer in the first display region and the second display region is 150 nm to 300 nm.

In the embodiments of the present disclosure, the first electrode is a reflective electrode, the third electrode is a transparent electrode, the second electrode is a reflective electrode, and the fourth electrode is a translucent electrode.

In the embodiments of the present disclosure, each of the first electrode and the second electrode includes a first transparent metal oxide layer, a metal layer and a second transparent metal oxide layer, the third electrode includes a transparent metal oxide layer, and the fourth electrode includes a transparent metal layer.

In the embodiments of the present disclosure, the first display region includes a pixel region and a non-pixel region arranged at a periphery of the pixel region, and the first electrode is merely arranged in the pixel region.

In the embodiments of the present disclosure, the non-pixel region in the first display region is not provided with an anode, thereby to improve the light transmittance of the first display region.

An embodiment is given hereinafter.

Second Embodiment

Figure 7:
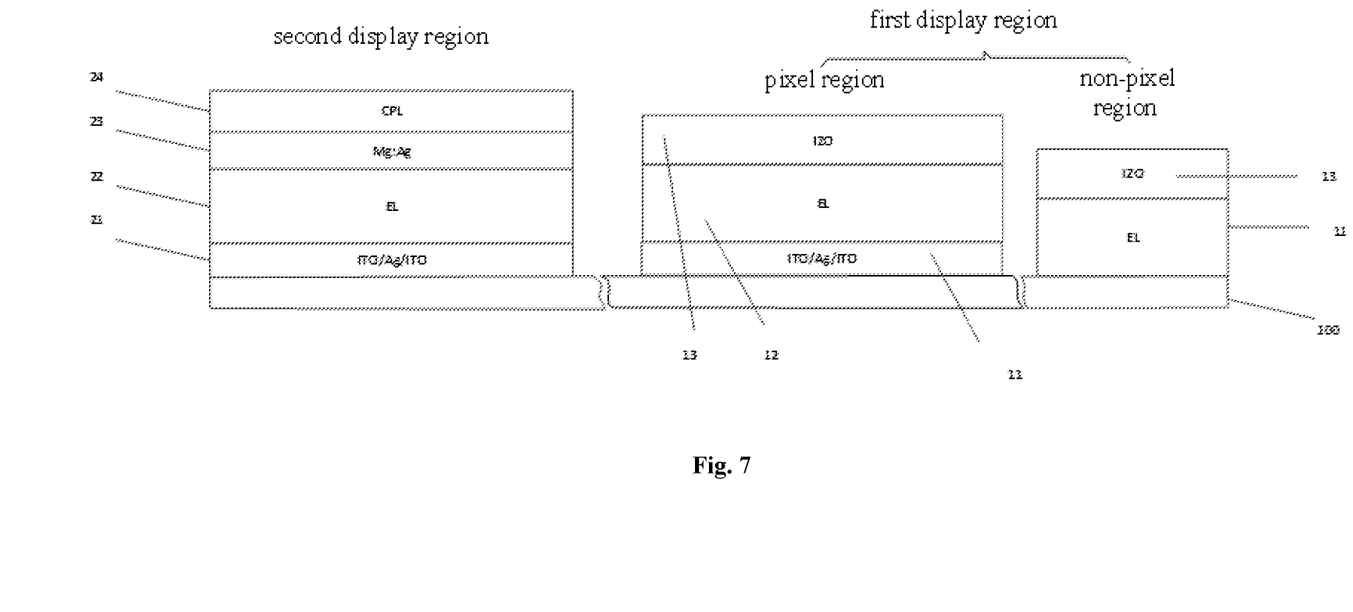
FIG. 7 is a schematic view showing a film layer of a display substrate according to a second embodiment of the present disclosure.

As shown in FIG. 7, the present disclosure provides in some embodiments a display substrate including a driving back plate 100. The driving back plate 100 includes a first display region and a second display region, the first display region includes a pixel region and a non-pixel region arranged at a periphery of the pixel region.

The AMOLED in the second display region includes a reflective anode 21 (e.g., a laminated structure of ITO, Ag, and ITO), an organic light-emitting layer 22, a translucent cathode 23 (e.g., an alloy material of Mg and Ag), and a capping layer 24.

In the embodiments of the present disclosure, a thickness of the capping layer is less than 100 nm.

The pixel region in the first display region includes a reflective anode 11 (e.g., a laminated structure of ITO, Ag, and ITO), an organic light-emitting layer 12, and a transparent cathode 13 (e.g., IZO).

In the embodiments of the present disclosure, a thickness of the transparent cathode 13 is 200 nm to 400 nm.

In the embodiments of the present disclosure, a thickness of the organic light-emitting layer in the first display region and the second display region is 150 nm to 300 nm.

The non-pixel region in the first display region includes an organic light-emitting layer 12 and a transparent cathode 13 (e.g., IZO). The reflective anode 11 is merely arranged in the pixel region, and the non-pixel region is not provided with the reflective anode 11.

If the PMOLED uses a double-sided transparent electrode and emits light on both sides, and light emitted from the bottom is lost through the back plate. In order to give consideration to the display efficiency, the first display region is made of a reflective anode and a transparent cathode or translucent cathode to improve the display effect of the pixel region in the first display region, and the non-pixel region is not provided with the reflective anode to improve the light transmittance.

In the embodiments of the present disclosure, the first electrode and the second electrode are reflective electrodes, and the third electrode and the fourth electrode are translucent electrodes.

In the embodiments of the present disclosure, each of the first electrode and the second electrode includes a first transparent metal oxide layer, a metal layer and a second transparent metal oxide layer, and each of the third electrode and the fourth electrode includes a transparent metal layer.

In the embodiments of the present disclosure, the first display region includes a pixel region and a non-pixel region arranged at a periphery of the pixel region, the non-pixel region is provided with an organic light-emitting layer and a transparent material pattern, the transparent material pattern is arranged at a side of the organic light-emitting layer away from the driving back plate, and the transparent material pattern restrains deposition of a material for forming the translucent electrode.

Due to the strong microcavity effect in the top-emitting device of the second display region, the screen efficiency and color gamut may be improved. In order to maintain the same display effect of the second display region as the first display region, the first display region may also adopt the same top-emitting structure as the second display region. However, in order to improve the light transmittance of the non-pixel region in the first display region, a transparent material pattern may be formed in the non-pixel region in the first display region prior to a metal top electrode being evaporated, and the transparent material pattern restrains deposition of a material (metal material) for forming the cathode of the PMOLED, so as to prevent the metal material of the top electrode from attaching to the surface of the first display region, thereby to not only ensure the display effect of the pixel region in the first display region, but also improve the light transmittance of the non-pixel region in the first display region. That is, the organic light-emitting layer and the transparent material pattern are arranged in the non-pixel region, and the transparent material pattern is arranged at a side of the organic light-emitting layer away from the driving back plate, and restrains deposition of a material (metal material) for forming a cathode. In the embodiments of the present disclosure, the transparent material pattern is used to further reduce the thickness of the organic light-emitting layer and improve the light transmittance. Alternatively, the material of the transparent material pattern includes fluoropolymer, polyethylene benzene, polyvinylcarbazole, or a polymer formed by a plurality of monomers, the monomer has an end group, and the end group includes at least one of biphenyl, phenyl, fluorene, and phenylene. The fluoropolymer includes at least one of Perfluorinated compound, Poly tetra fluoroethylene (PTFE), etc. The transparent material has low desorption energy for the metal material and high activation for metal material diffusion, and the deposition of the metal material on the surface of the transparent material is restrained at high temperatures or subsequence to a low vapor impingement. An embodiment is given hereinafter.

Third Embodiment

Figure 8:
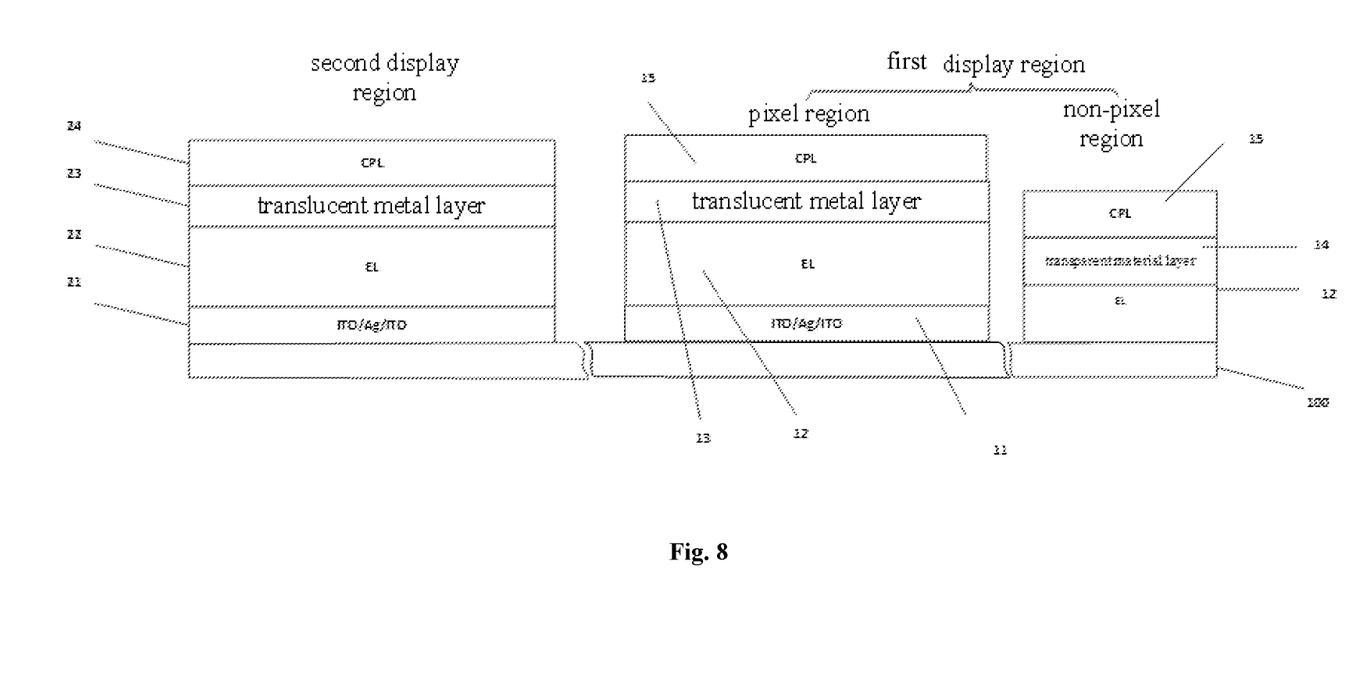
FIG. 8 is a schematic view showing a film layer of a display substrate according to a third embodiment of the present disclosure.

As shown in FIG. 8, the present disclosure provides in some embodiments a display substrate including a driving back plate 100. The driving back plate 100 includes a second display region and a first display region, the first display region includes a pixel region and a non-pixel region arranged at a periphery of the pixel region.

The AMOLED in the second display region includes a reflective anode 21 (e.g., a laminated structure of ITO, Ag, and ITO), an organic light-emitting layer 22, a translucent cathode 23 (a translucent metal layer, e.g., an alloy material of Mg and Ag), and a capping layer 24. Alternatively, a thickness of the translucent cathode 23 is 10 nm to 20 nm.

The pixel region in the first display region includes a reflective anode 11 (e.g., a laminated structure of ITO, Ag, and ITO), an organic light-emitting layer 12, and a transparent cathode 13 (a translucent metal layer, e.g., an alloy material of Mg and Ag), and a capping layer 15. Alternatively, a thickness of the translucent cathode 23 is 10 nm to 20 nm.

The non-pixel region in the first display region includes an organic light-emitting layer 12, a transparent material pattern 14, and a capping layer 15. The reflective anode 11 is merely arranged in the pixel region, and the non-pixel region is not provided with the reflective anode 11. Alternatively, a thickness of the transparent material pattern 14 is 5 nm to 10 nm.

In the embodiments of the present disclosure, the second display region further includes a capping layer arranged at a side of the second electrode away from the driving back plate, and the capping layer includes a first portion arranged at a same layer and made of a same material as the third electrode, so as to prevent overlapping black lines from appearing at an interface between the second display region and the first display region.

An embodiment is given hereinafter.

Fourth Embodiment

Figure 9:
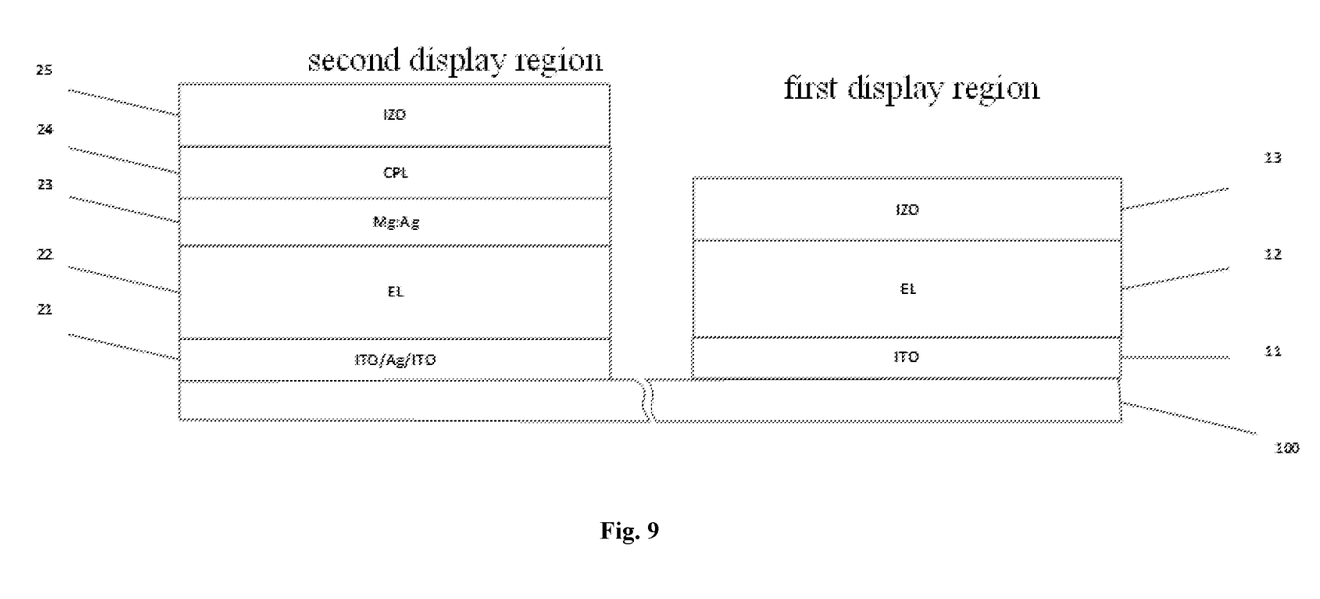
FIG. 9 is a schematic view showing a film layer of a display substrate according to a fourth embodiment of the present disclosure.

As shown in FIG. 9, the present disclosure provides in some embodiments a display substrate including a driving back plate 100. The driving back plate 100 includes a second display region and a first display region.

The AMOLED in the second display region includes a reflective anode 21, an organic light-emitting layer (EL) 22, a translucent cathode 23, and a capping layer 24. The capping layer includes a first portion arranged at a same layer and made of a same material as the third electrode, and a second portion (capping Layer, CPL) between the first portion and the translucent cathode 23. The second portion is made of an organic material, the reflective anode 21 is made of a laminated structure of ITO, Ag and ITO, the translucent cathode 23 may is made of an alloy material of Mg and Ag, and the first portion is made of IZO. Alternatively, a thickness of the second portion (CPL) is less than 100 nm, and a thickness of the reflective anode 21 is 20 nm.

The light-emitting unit in the first display region includes a transparent anode 11, an organic light-emitting layer 12, and a transparent cathode 13. The transparent anode 11 is made of ITO, and the transparent cathode 13 is made of IZO.

In the embodiments of the present disclosure, a thickness of the transparent anode 11 is 100 nm, and a thickness of the transparent cathode 13 is 200 nm to 400 nm.

In the embodiments of the present disclosure, a thickness of the organic light-emitting layer in the first display region and the second display region is 150 nm to 300 nm.

The transparent cathode 13 is entirely covered to prevent overlapping black lines from appearing at an interface between the second display region and the first display region.

In the embodiments of the present disclosure, the second portion in the capping layer above the translucent cathode 23 in the second display region may also be omitted, or both the second portion in the capping layer and the translucent cathode may be omitted, thereby to reduce film thickness.

The present disclosure further provides in some embodiments a display panel, including the above-mentioned display substrate.

In the embodiments of the present disclosure, the display substrate further includes a packaging layer for packaging the display substrate.

Figure 10:
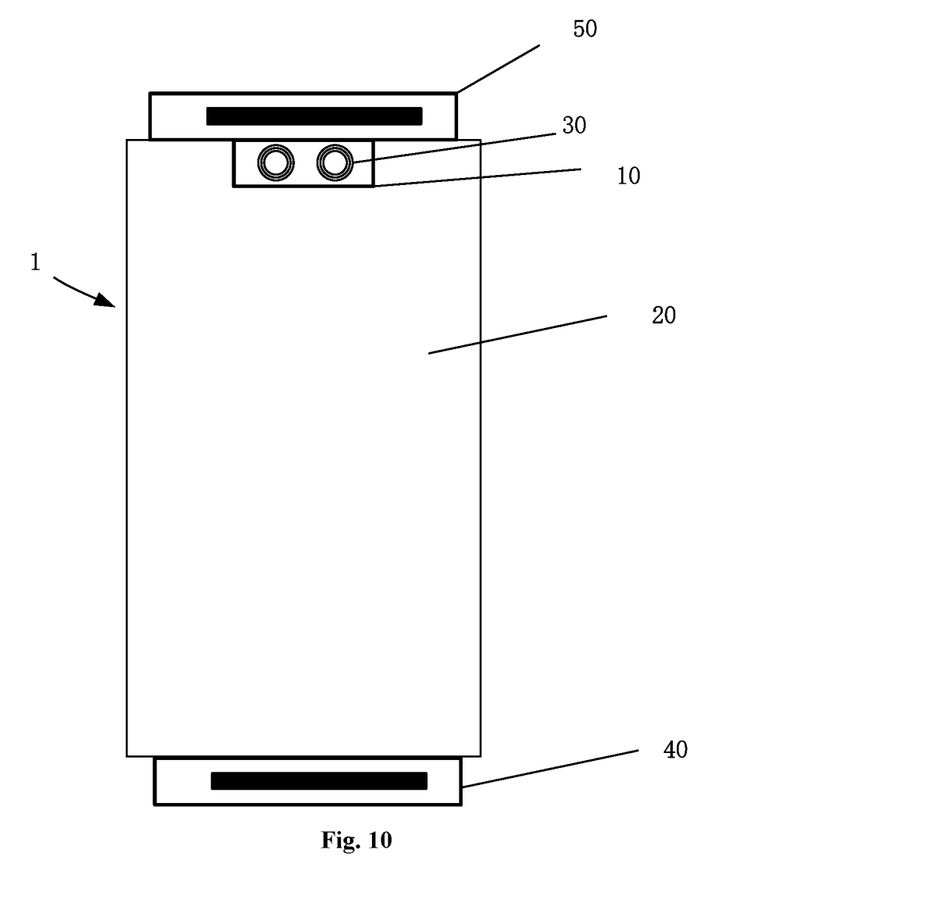
FIG. 10 is a schematic view showing an electronic device according to one embodiment of the present disclosure.

As shown in FIG. 10, the present disclosure further provides in some embodiments an electronic device, including a display panel 1 and an under-screen camera 30. The structure of the display panel 1 is similar to the structure of the display panel in the above embodiments of the present disclosure. The under-screen camera 30 is arranged at a side of the first display region 10 in the display panel 1 away from a display side of the electronic device, and a projection of a photosensitive surface of the under-screen camera 30 in the first display region 10 is arranged in the first display region 10.

The electronic device may be an electronic device such as a mobile phone or a tablet computer.

In the embodiments of the present disclosure, the electronic device further includes a first driving control IC 40 coupled to an AMOLED in the second display region to drive the AMOLED, and a second driving control IC 50 coupled to the light-emitting unit in the first display region to drive the light-emitting unit. In order to realize fullscreen, the first driving control IC 40 and the second driving control IC 50 may be bent to a non-display side of the display panel.

In the embodiments of the present disclosure, the first display region in the display panel and the under-screen camera are arranged opposite to each other, if the camera is detected to be turned on, the first display region is controlled not to display and to be in a light transmission state, and if camera is detected to be turned off, the first display region and the second display region are controlled to display together. AMOLED is arranged in the second display region to ensure the display effect, the light-emitting unit driving control IC being arranged in the first display region is relatively simple, and virtual light-emitting units are formed, and light transmittance of the screen is relatively high, so as to ensure photographing effect of the camera.

The present disclosure further provides in some embodiment a display method for the above-mentioned electronic device, the method including: in a display mode, if it is detected that the under-screen camera is turned on, the light-emitting units in the first display region is controlled to be turned off; and if it is detected that the under-screen camera is turned off, the light-emitting units in the first display region is controlled to be turned on.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A display substrate, comprising:
   a driving back plate, comprising a first display region and a second display region;
   an anode pattern, arranged at a side of the driving back plate, and comprising a plurality of first electrodes in the first display region and a plurality of second electrodes in the second display region, and the plurality of first electrodes being of strip shapes extending along a first direction and being spaced apart from each other along a second direction;
   a light-emitting layer, arranged at a side of the anode pattern away from the driving back plate, and comprising a first light-emitting portion in the first display region and a second light-emitting portion in the second display region;
   a cathode pattern, arranged at a side of the light-emitting layer away from the driving back plate, and comprising a plurality of third electrodes in the first display region and a fourth electrode in the second display region, and the plurality of third electrodes being of strip shapes extending along the second direction and being spaced apart from each other along the first direction; and
   wherein the plurality of first electrodes and the plurality of third electrodes are arranged in an intersecting manner to form a plurality of intersections, a part of the intersections form light-emitting units, and a part of the intersections form virtual light-emitting units.

2. The display substrate according to claim 1, wherein a width of the first electrode in the second direction at an intersection where the light-emitting unit is formed is greater than a width of the first electrode in the second direction at an intersection where the virtual light-emitting unit is formed, or a width of the third electrode in the first direction at an intersection where the light-emitting unit is formed is greater than a width of the third electrode in the first direction at an intersection where the virtual light-emitting unit is formed.

3. The display substrate according to claim 2, wherein two of four intersections in two adjacent rows and two adjacent columns form the light-emitting units, the other two of the four intersections form the virtual light-emitting units, and two intersections forming the light-emitting units are arranged on a diagonal line of a rectangle formed by the four intersections.

4. The display substrate according to claim 1, wherein the first electrode and the third electrode are transparent electrodes, the second electrode is a reflective electrode, and the fourth electrode is a translucent electrode.

5. The display substrate according to claim 4, wherein each of the first electrode and the third electrode comprises a transparent metal oxide layer, the second electrode comprises a first transparent metal oxide layer, a metal layer and a second transparent metal oxide layer, and the fourth electrode comprises a transparent metal layer.

6. The display substrate according to claim 1, wherein the first electrode is a reflective electrode, the third electrode is a transparent electrode, the second electrode is a reflective electrode, and the fourth electrode is a translucent electrode.

7. The display substrate according to claim 6, wherein each of the first electrode and the second electrode comprises a first transparent metal oxide layer, a metal layer and a second transparent metal oxide layer, the third electrode comprises a transparent metal oxide layer, and the fourth electrode comprises a transparent metal layer.

8. The display substrate according to claim 7, wherein the first display region comprises a pixel region and a non-pixel region arranged at a periphery of the pixel region, and the first electrode is merely arranged in the pixel region.

9. The display substrate according to claim 4, wherein the second display region further comprises a capping layer arranged at a side of the second electrode away from the driving back plate, and the capping layer comprises a first portion arranged at a same layer and made of a same material as the third electrode.

10. The display substrate according to claim 1, wherein both the first electrode and the second electrode are reflective electrodes, and both the third electrode and the fourth electrode are translucent electrodes.

11. The display substrate according to claim 10, wherein each of the first electrode and the second electrode comprises a first transparent metal oxide layer, a metal layer and a second transparent metal oxide layer, and each of the third electrode and the fourth electrode comprises a transparent metal layer.

12. The display substrate according to claim 10, wherein the first display region comprises a pixel region and a non-pixel region arranged at a periphery of the pixel region, the non-pixel region is provided with an organic light-emitting layer and a transparent material pattern, the transparent material pattern is arranged at a side of the organic light-emitting layer away from the driving back plate, and the transparent material pattern is configured to restrain deposition of a material for forming the translucent electrode.

13. The display substrate according to claim 12, wherein a thickness of the transparent material pattern is 5 nm to 10 nm.

14. The display substrate according to claim 12, wherein the material of the transparent material pattern comprises fluoropolymer, polyethylene benzene, polyvinylcarbazole, or a polymer formed by a plurality of monomers, the monomer has an end group, and the end group comprises at least one of biphenyl, phenyl, fluorene, and phenylene.

15. The display substrate according to claim 1, wherein the second display region is of a concave shape with a notch at the top, and the first display region is arranged in the notch.

16. A display panel comprising the display substrate according to claim 1.

17. An electronic device, comprising the display panel according to claim 16 and an under-screen camera, wherein the under-screen camera is arranged at a side of the first display region of the display panel away from the display side of the electronic device, and a projection of a photosensitive surface of the under-screen camera onto the first display region is arranged in the first display region.

18. A display method applied to the electronic device according to claim 17, wherein the method comprising:
   in a display mode, if it is detected that the under-screen camera is turned on, controlling the light-emitting units in the first display region to be turn off; and if it is detected that the under-screen camera is turned off, controlling the light-emitting units in the first display region to turn on.

* * * * *